(12) United States Patent
Lee

(10) Patent No.: US 9,337,651 B2
(45) Date of Patent: May 10, 2016

(54) ELECTROSTATIC DISCHARGE PROTECTION CIRCUIT

(71) Applicant: VIA Alliance Semiconductor Co., Ltd., Shanghai (CN)

(72) Inventor: Yeong-Sheng Lee, Fremont, CA (US)

(73) Assignee: VIA ALLIANCE SEMICONDUCTOR CO., LTD., Shanghai (CN)

(*) Notice: Subject to any disclaimer, the term of this patent is extended or adjusted under 35 U.S.C. 154(b) by 0 days.

(21) Appl. No.: 14/259,511

(22) Filed: Apr. 23, 2014

(65) Prior Publication Data

US 2015/0311700 A1    Oct. 29, 2015

(51) Int. Cl.
*H02H 9/04*    (2006.01)
*H01L 27/02*    (2006.01)

(52) U.S. Cl.
CPC ............. *H02H 9/04* (2013.01); *H01L 27/0285* (2013.01); *H02H 9/046* (2013.01)

(58) Field of Classification Search
USPC .......................................................... 361/56
See application file for complete search history.

(56) References Cited

U.S. PATENT DOCUMENTS

| | | | | |
|---|---|---|---|---|
| 5,654,571 | A * | 8/1997 | Tsuji | ................... H01L 27/0251 257/354 |
| 5,946,175 | A * | 8/1999 | Yu | .................... H03K 17/08122 361/56 |
| 6,385,021 | B1 * | 5/2002 | Takeda | ................ H01L 27/0266 361/111 |
| 6,963,112 | B2 | 11/2005 | Chen | |
| 8,094,422 | B2 | 1/2012 | Sasaki | |
| 8,243,403 | B2 | 8/2012 | Liang et al. | |
| 8,576,526 | B2 * | 11/2013 | Chu | ....................... H02H 9/046 361/56 |
| 2011/0026175 | A1 | 2/2011 | Ker et al. | |
| 2011/0128657 | A1 | 6/2011 | Akai et al. | |
| 2013/0222954 | A1 | 8/2013 | Demange | |

FOREIGN PATENT DOCUMENTS

| | | |
|---|---|---|
| CN | 202917970 | 5/2013 |
| JP | 2009295855 A | 12/2009 |
| TW | 200524133 | 7/2005 |
| TW | 201042747 | 12/2010 |
| WO | WO 2006/053337 | 5/2006 |

OTHER PUBLICATIONS

European Search Report dated Aug. 24, 2015, issued in application No. 14193178.2-1504.

* cited by examiner

*Primary Examiner* — Stephen W Jackson
*Assistant Examiner* — Ann Hoang
(74) *Attorney, Agent, or Firm* — McClure, Qualey & Rodack, LLP

(57) ABSTRACT

An electrostatic discharge (ESD) protection circuit includes a first n-type transistor, a discharge acceleration circuit and a discharge time circuit. The first n-type transistor has a first terminal coupled to a supply voltage, a second terminal coupled to a reference voltage, and a gate, wherein the first n-type transistor couples the supply voltage to the reference voltage during an ESD event at an I/O pad. The discharge acceleration circuit is coupled to the gate of the first n-type transistor to the I/O pad during the ESD event and coupled to the gate of the first n-type transistor to the reference voltage when there is no ESD event. The discharge time circuit, coupled to the discharge acceleration circuit and the supply voltage, controls a discharge time of the first n-type transistor of coupling the supply voltage to the reference voltage during the ESD event at the I/O pad.

8 Claims, 4 Drawing Sheets

ELECTROSTATIC DISCHARGE PROTECTION CIRCUIT

BACKGROUND OF THE INVENTION

1. Field of the Invention

The invention relates to an electrostatic discharge (ESD) protection circuit and, more particularly, to an electrostatic discharge (ESD) protection circuit for application in the integrated circuits of low-power processes.

2. Description of the Related Art

Electrostatic discharge (ESD) is the sudden and momentary electric current that flows between two electric elements of different electrical potentials. ESD events may cause damage to electronic equipment, especially in solid-state electronics, such as integrated circuits. As fabrication of integrated circuits is moving into low-power processes, the circuits are more vulnerable to stress due to ESD. For the low-power processes in portable devices, the MOSFET (Metal-Oxide-Semiconductor Field-Effect Transistor) conducts lower currents due to lower supply voltages for power-saving reasons in the low-power processes. Thus there is a need to design the Electrostatic discharge (ESD) protection circuit capable of conducting larger ESD discharge current under low supply voltages.

BRIEF SUMMARY OF THE INVENTION

An embodiment of the present invention provides an electrostatic discharge (ESD) protection circuit. The electrostatic discharge (ESD) protection circuit includes a first n-type transistor, a discharge acceleration circuit and a discharge time circuit. The first n-type transistor has a first terminal coupled to a supply voltage, a second terminal coupled to a reference voltage, and a gate, wherein the first n-type transistor couples the supply voltage to the reference voltage during an ESD event at an I/O pad. The discharge acceleration circuit is coupled to the gate of the first n-type transistor to the I/O pad during the ESD event and coupled to the gate of the first n-type transistor to the reference voltage when there is no ESD event. The discharge time circuit, coupled to the discharge acceleration circuit and the supply voltage, controls a discharge time of the first n-type transistor of coupling the supply voltage to the reference voltage during the ESD event at the I/O pad, wherein the supply voltage is coupled to the I/O pad, wherein a voltage potential of the I/O pad is higher than the supply voltage or lower than the reference voltage during the ESD event.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
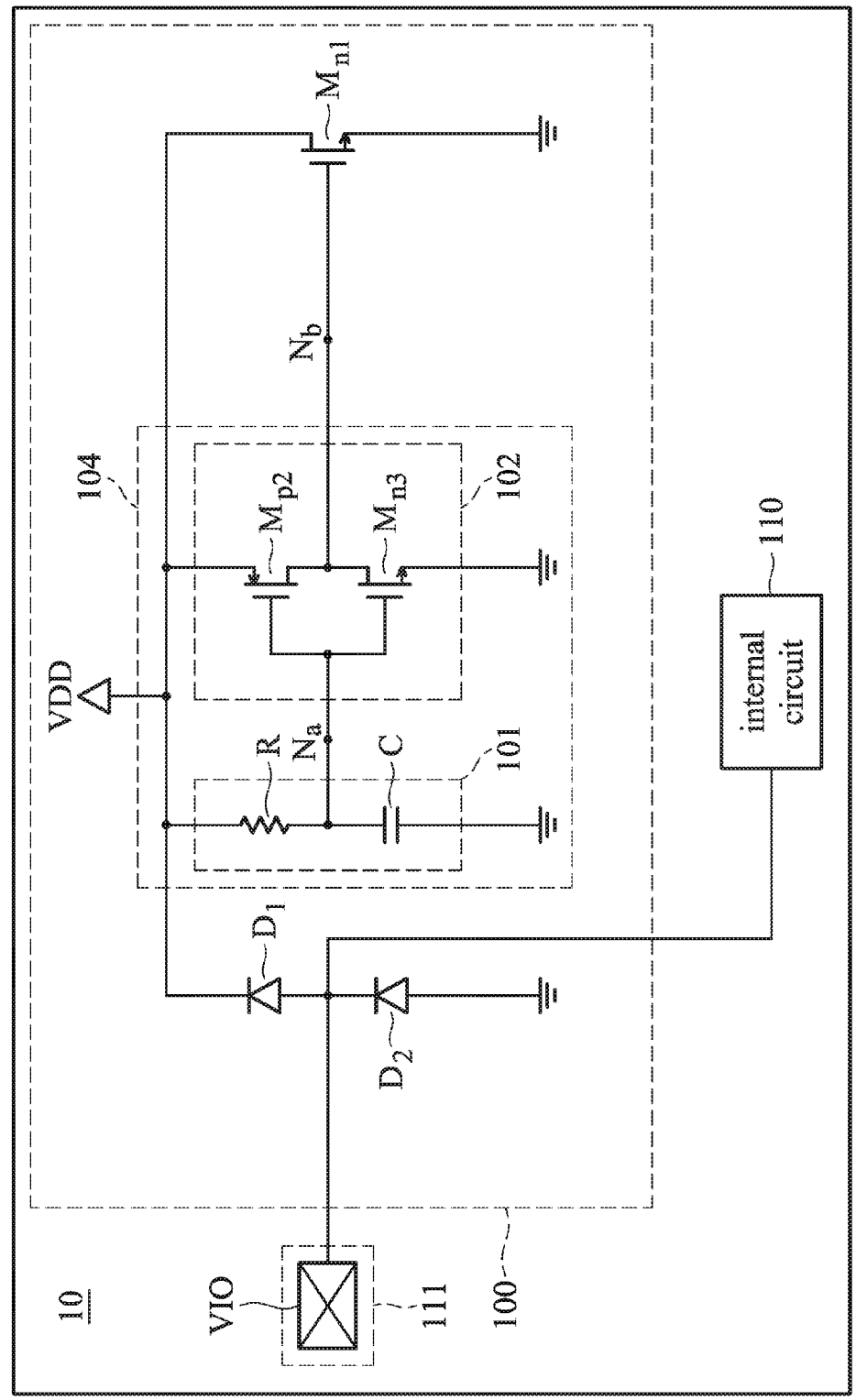
FIG. 1 shows an electrostatic discharge (ESD) protection circuit 100 of an integrated circuit 10 according to an embodiment of the present invention.

FIG. 1 shows an electrostatic discharge (ESD) protection circuit 100 of an integrated circuit 10 according to an embodiment of the present invention. As per the embodiment shown in FIG. 1, the integrated circuit 10 includes an electrostatic discharge (ESD) protection circuit 100, an I/O pad 111 and an internal circuit 110. The I/O pad 111 is an input terminal of the internal circuit 110 which may receive input signals to the internal circuit 110. The electrostatic discharge (ESD) protection circuit 100 is coupled to the I/O pad 111 and the internal circuit 110. The electrostatic discharge (ESD) protection circuit 100 includes a first diode $D_1$, a second diode $D_2$, a discharge time circuit 104 comprising a resistance-capacitance (RC) time-constant circuit 101 and an inverter 102 and a first n-type MOSFET $M_{n1}$.

The first diode $D_1$ has an anode coupled to an I/O pad 111 of an internal circuit 110 of an integrated circuit and a cathode coupled to a first voltage node such as a power-supply voltage node VDD in this embodiment. The internal circuit 110 of the integrated circuit is the protected object of the Electrostatic discharge (ESD) protection circuit 100. The second diode $D_2$ has an anode coupled to a second voltage node with a reference voltage such as a ground in this embodiment and a cathode coupled to the I/O pad 111. The second diode $D_2$ prevents the voltage at the I/O pad 111 from dropping too much below the ground should a negative ESD event occur. The RC time-constant circuit 101 is coupled between the power-supply voltage node VDD and the ground. The inverter 102 has an input terminal coupled to an output terminal $N_a$ of the RC time-constant circuit 101 and an output terminal The first n-type MOSFET (Metal-Oxide-Semiconductor Field-Effect Transistor) $M_{n1}$ has a first terminal coupled to the power-supply voltage node VDD, a second terminal coupled to the ground and a gate coupled to an output terminal $N_b$ of the inverter 102.

As shown in FIG. 1, the RC time-constant circuit 101 comprises a resistor R and a capacitor C and the inverter 102 comprises a second p-type MOSFET $M_{p2}$ and a third n-type MOSFET $M_{n3}$, in this embodiment. Although a CMOS (Complementary metal-oxide-semiconductor) inverter is used here as an example, the inverter 102 may be implemented in various ways for one having ordinary skill in the art. The resistor R is coupled between the power-supply voltage node VDD and the output terminal $N_a$ of the RC time-constant circuit 101 and the capacitor C is coupled between the output terminal $N_a$ of the RC time-constant circuit 101 and the ground. The capacitor C acts as an open circuit under steady state and conducts current under transient state; therefore, under normal conditions (i.e., no ESD events) the output terminal $N_a$ of the RC time-constant circuit 101 is at the voltage level of the power-supply voltage node VDD (i.e., logic "high"), and the output terminal $N_b$ of the inverter 102 is at the voltage level of the ground (i.e., logic "low") which turns off the first n-type MOSFET $M_{n1}$ to prevent leakage between the power-supply voltage node VDD and ground.

When the electrostatic discharge (ESD) event occurs at the I/O pad 111, the voltage potential $V_{IO}$ at the I/O pad 111 is substantially higher than the voltage level at the power-supply voltage node VDD will supply during normal operation. The first diode $D_1$ is turned on, and the ESD current flows through the first diode $D_1$ so that the effect of the voltage potential $V_{IO}$ on the power-supply voltage node VDD is reduced by a diode voltage drop and the capacitor C conducts transient current which lowers the voltage level at the output terminal $N_a$ of the RC time-constant circuit 101. After a time determined by the RC time constant depending on the resistance of the resistor R and the capacitance of the capacitor C, the voltage potential at the voltage node $N_b$ pulls high. Thus the voltage potential at the gate of the first n-type MOSFET $M_{n1}$ is substantially biased by the voltage level at the power-supply voltage node VDD. Then the first n-type MOSFET $M_{n1}$ turns on, thereby providing a discharge path for the ESD current caused by the voltage potential $V_{IO}$. It is notable that the RC time-constant circuit 101 may also control the discharge time (the turn-on time of the first n-type MOSFET $M_{n1}$) by adjusting the resistance of the resistor R and the capacitance of the capacitor C. For example, the discharge time can be set to 600 ns.

When the transient ESD event comes to an end after being effectively discharged via the first n-type MOSFET $M_{n1}$, the ESD voltage stress at the I/O pad 111 disappears. The first diode $D_1$ then turns off Under the steady state of normal conditions, the output terminal $N_a$ of the RC time-constant circuit 101 gradually returns to the voltage level of the power-supply voltage node VDD, and the first n-type MOSFET $M_{n1}$ turns off and the ESD protection circuit 100 stops responding to the ESD event.

Figure 2:
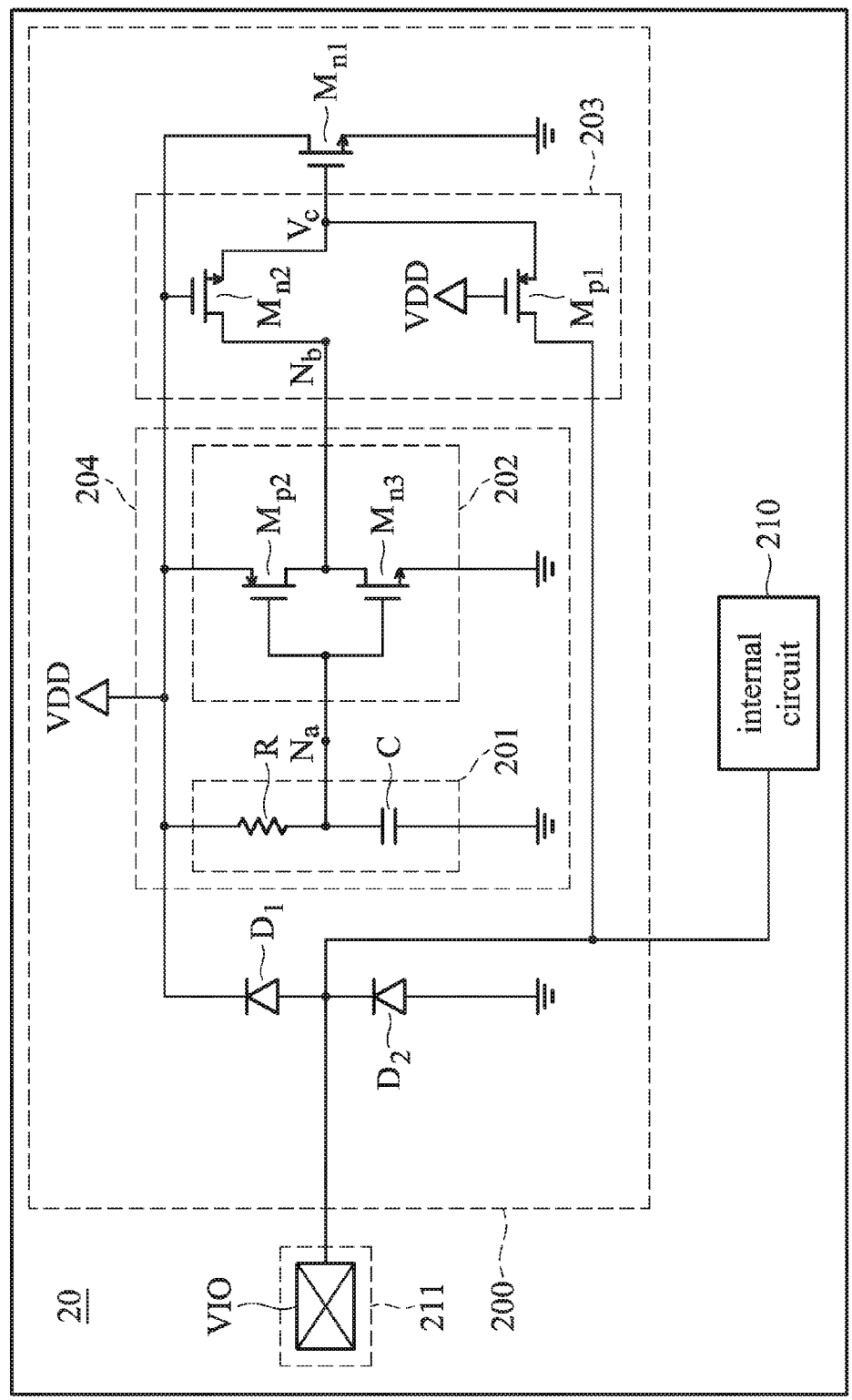
FIG. 2 shows an electrostatic discharge (ESD) protection circuit 200 of an integrated circuit 20 according to another embodiment of the present invention.

FIG. 2 shows an electrostatic discharge (ESD) protection circuit 200 of an integrated circuit 20 according to another embodiment of the present invention. As per the embodiment shown in FIG. 2, the integrated circuit 20 includes an electrostatic discharge (ESD) protection circuit 200, an I/O pad 211 and an internal circuit 210. The I/O pad 211 is an input terminal of the internal circuit 210 which may receive input signals to the internal circuit 210. The electrostatic discharge (ESD) protection circuit 200 is connected to the I/O pad 211 and the internal circuit 210. The Electrostatic discharge (ESD) protection circuit 200 includes a first diode $D_1$, a second diode $D_2$, a discharge time circuit 204 comprising a resistance-capacitance (RC) time-constant circuit 201 and an inverter 202, a first n-type MOSFET $M_{n1}$, and a discharge acceleration circuit 203 comprising a second n-type MOSFET $M_{n2}$ and a first p-type MOSFET $M_{p1}$.

The first diode $D_1$ has an anode coupled to an I/O pad 211 of an internal circuit 210 of an integrated circuit and a cathode coupled to a first voltage node such as a power-supply voltage node VDD in this embodiment. The internal circuit 210 of the integrated circuit is the protected object of the Electrostatic discharge (ESD) protection circuit 200. The second diode $D_2$ has an anode coupled to a second voltage node with a reference voltage such as a ground in this embodiment and a cathode coupled to the I/O pad 211. The RC time-constant circuit 201 is coupled between the power-supply voltage node VDD and the ground. The inverter 202 has an input terminal coupled to an output terminal $N_a$ of the RC time-constant circuit 201 and an output terminal The first n-type MOSFET $M_{n1}$ has a first terminal coupled to the power-supply voltage node VDD, a second terminal coupled to the ground and a gate. As shown in FIG. 2, the RC time-constant circuit 201 comprises a resistor R and a capacitor C, and the inverter 202 comprises a second p-type MOSFET $M_{p2}$ and a third n-type MOSFET $M_{n3}$ in this embodiment. The resistor R is coupled between the power-supply voltage node VDD and the voltage node $N_a$ and the capacitor C is coupled between the voltage node $N_a$ and the ground.

Compared to the electrostatic discharge (ESD) protection circuit 100 disclosed in the embodiment of FIG. 1, the electrostatic discharge (ESD) protection circuit 200 further includes the second n-type MOSFET $M_{n2}$ and the first p-type MOSFET $M_{p1}$ to enhance the performance of the electrostatic discharge (ESD) protection circuit. The second n-type MOSFET $M_{n2}$ has a first terminal coupled to the output terminal $N_b$ of the inverter 202, a second terminal coupled to the gate of the first n-type MOSFET $M_{n1}$ and a gate coupled to the power-supply voltage node VDD. The first p-type MOSFET $M_{p1}$ has a first terminal coupled to the I/O pad 211, a second terminal coupled to the gate of the first n-type MOSFET $M_{n1}$ and a gate coupled to the power-supply voltage node VDD.

When the electrostatic discharge (ESD) event occurs at the I/O pad 211, the voltage potential $V_{IO}$ at the I/O pad 211 is substantially higher than the voltage level at the power-supply voltage node VDD will supply in normal operation. The first p-type MOSFET $M_{p1}$ turns on because the electrostatic voltage $V_{IO}$ at the first terminal is higher than the voltage level of the power-supply voltage node VDD at the gate. The voltage $V_c$ at the gate of the first n-type MOSFET $M_{n1}$ rises nearly to $V_{IO}$. Then the first n-type MOSFET $M_{n1}$ turns on such that the ESD current flows through the first n-type MOSFET $M_{n1}$ to discharge.

Compared to the electrostatic discharge (ESD) protection circuit 100 disclosed in the embodiment of FIG. 1, the first p-type MOSFET $M_{p1}$ of the discharge acceleration circuit 203 can provide a much higher voltage $V_c$ at the gate of the first n-type MOSFET $M_{n1}$ (In the embodiment of FIG. 1, the voltage $V_c$ at the gate of the first n-type MOSFET $M_{n1}$ only rises nearly to the voltage level of VDD). The higher voltage $V_c$ helps the first n-type MOSFET $M_{n1}$ discharge faster so the voltage potential $V_{IO}$ at the I/O pad 211 and the power-supply voltage node VDD will not be charged up as high as it was in the embodiment of FIG. 1 previously. In addition, a faster discharge time allows for a smaller chip-size design for the first n-type MOSFET $M_{n1}$.

When the transient ESD event comes to an end after being effectively discharged via the first n-type MOSFET $M_{n1}$, the voltage potential $V_{IO}$ at the I/O pad 211 is lower than the voltage level of the power-supply voltage node VDD and thus the first p-type MOSFET $M_{p1}$ turns off The first diode $D_1$ turns off due to there being a lower voltage potential $V_{IO}$ than the voltage level of the power-supply voltage node VDD. The voltage potential at the voltage node $N_a$ rises up to the voltage level of VDD and the output of the inverter 202 goes down to ground similar to that described in above. The second n-type MOSFET $M_{n2}$ of the discharge acceleration circuit 203 subsequently turns on and pulls the voltage potential $V_c$ at the gate of the first n-type MOSFET $M_{n1}$ down to ground, and the first n-type MOSFET $M_{n1}$ turns off.

Figure 3:
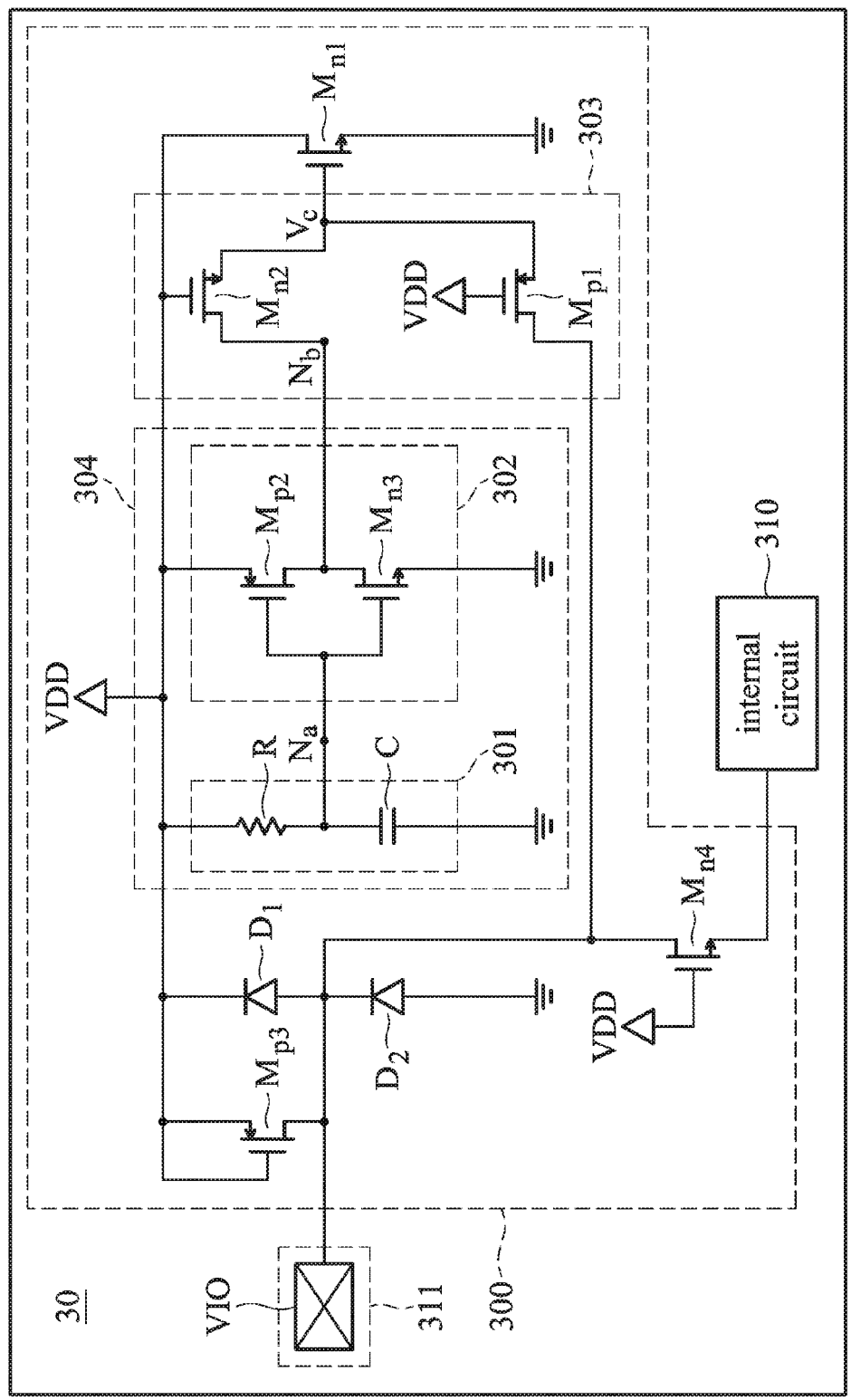
FIG. 3 shows an electrostatic discharge (ESD) protection circuit 300 of an integrated circuit 30 according to another embodiment of the present invention.

FIG. 3 shows an electrostatic discharge (ESD) protection circuit 300 of an integrated circuit 30 according to another embodiment of the present invention. As per the embodiment shown in FIG. 3, the integrated circuit 30 includes an electrostatic discharge (ESD) protection circuit 300, an I/O pad 311 and an internal circuit 310. The I/O pad 311 is an input terminal of the internal circuit 310 which may receive input signals to the internal circuit 310. The electrostatic discharge (ESD) protection circuit 300 is coupled to the I/O pad 311 and the internal circuit 310. The electrostatic discharge (ESD) protection circuit 300 includes a first diode $D_1$, a second diode $D_2$, a discharge time circuit 304 comprising a resistance-capacitance (RC) time-constant circuit 301 and an inverter 302, a first n-type MOSFET $M_{n1}$, a discharge acceleration circuit 303 comprising a second n-type MOSFET $M_{n2}$ and a first p-type MOSFET $M_{p1}$, a fourth n-type MOSFET $M_{n4}$ and a third p-type MOSFET $M_{p3}$.

Compared to the electrostatic discharge (ESD) protection circuit 200 disclosed in the embodiment of FIG. 2, the electrostatic discharge (ESD) protection circuit 300 further includes the fourth n-type MOSFET $M_{n4}$ and the third p-type MOSFET $M_{p3}$ to enhance the circuit's performance. The third p-type MOSFET $M_{p3}$ has a first terminal coupled to the power-supply voltage node VDD, a second terminal coupled to the I/O pad 311 and a gate coupled to the first terminal (and the power-supply voltage node VDD). The fourth n-type MOSFET $M_{n4}$ has a first terminal coupled to the I/O pad 311, a second terminal coupled to an internal circuit 310 of an integrated circuit, and a gate coupled to the power-supply voltage node VDD.

Typical voltage drop at the first diode $D_1$ in ESD protection circuits is about 1.7V without the third p-type MOSFET $M_{p3}$. It causes the ESD discharging to occur at the I/O pad 311 only when the voltage potential $V_{IO}$ at the I/O pad 311 is larger than the voltage level of the power-supply voltage node VDD by 1.7V.

The turn-on voltage of the third p-type MOSFET $M_{p3}$ may be designed to be about 1V. Thus the third p-type MOSFET $M_{p3}$ can be added to speed up the discharging of the ESD event because the turn-on voltage of the third p-type MOSFET $M_{p3}$ is less than the voltage drop at the first diode $D_1$. Also adding the third p-type MOSFET $M_{p3}$ into the electrostatic discharge (ESD) protection circuit 300 can reduce the resistance between the power-supply voltage node VDD and the I/O pad 311 and add a new discharging path flowed through the third p-type MOSFET $M_{p3}$. The above two advantages of adding the third p-type MOSFET $M_{p3}$ into the electrostatic discharge (ESD) protection circuit 300 increases the ESD current and shortens the discharge time.

In some discharge cases in the embodiment of FIG. 2, the voltage potential $V_{IO}$ at the I/O pad 211 can be very high if the discharging is fast enough. The high voltage potential $V_{IO}$ may destroy the physical structure of the input of the internal circuit 210. In order to avoid this, the electrostatic discharge (ESD) protection circuit 300 further includes the fourth n-type MOSFET $M_{n4}$ to isolate the voltage potential $V_{IO}$ at the I/O pad 311 from the internal circuit 310. When an ESD event occurs at the I/O pad 311, since the gate of the fourth n-type MOSFET $M_{n4}$ is at a voltage level of the power-supply voltage node VDD and the first terminal of $M_{n4}$ (coupled to the I/O pad 311) has a voltage level higher than that of VDD, the voltage level of the second terminal of $M_{n4}$ (coupled to the internal circuit 310) cannot rise above that of VDD. Thus the voltage potential $V_{IO}$ at the I/O pad 311 which is substantially higher than the voltage level of VDD will not be applied to the input of the internal circuit 310 during the ESD event, and the physical structure of the input of the internal circuit 310 is protected by the fourth n-type MOSFET $M_{n4}$. Under normal conditions (i.e., no ESD events), the voltage potential $V_{IO}$ at the I/O pad 311 which receives input signals may not be higher than the voltage level of VDD, and thus the input signals may be transmitted to the internal circuit 310 by the fourth n-type MOSFET $M_{n4}$ accordingly.

Figure 4:
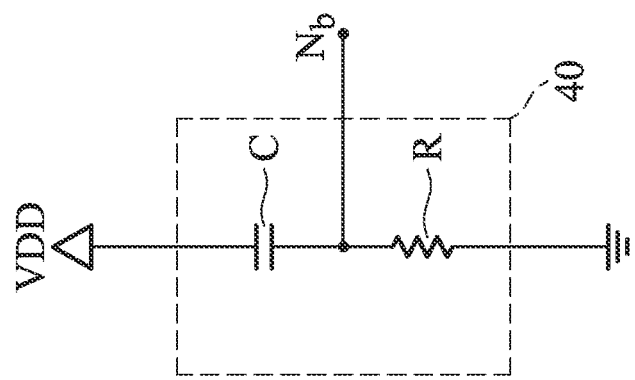
FIG. 4 shows another resistance-capacitance (RC) time-constant circuit 301 of the electrostatic discharge (ESD) protection circuit 300 according to an embodiment of the present invention.

FIG. 4 shows another discharge time circuit 40 which may be used in any of the above electrostatic discharge (ESD) protection circuits 100, 200, or 300 according to an embodiment of the present invention. In this embodiment, the discharge time circuit 40 comprises a resistor R and a capacitor C and does not require an inverter. The resistor R is coupled between the output terminal $N_b$ of the discharge time circuit 40 and the ground, and the capacitor C is coupled between the power-supply voltage node VDD and the output terminal $N_b$ of the discharge time circuit 40. Similar to the above descriptions, the capacitor C acts as an open circuit under steady state and conducts current under transient state; therefore, the output terminal $N_b$ is at the voltage level of the ground (i.e., logic "low") to turn off $M_{n1}$ under normal conditions (i.e., no ESD events), and is at the voltage level of VDD (i.e., logic "high") to turn on $M_{n1}$ under ESD events. It is notable that the discharge time circuit 40 and the discharge acceleration circuit may also be replaced by any type of circuit which has equivalent circuit performance. In one embodiment, the internal circuits 110, 210, and 310 in the above may comprise an input buffer circuit coupled to the I/O pads 111, 211, or 311. It is appreciated that the input buffer circuit may be implemented in various ways for one having ordinary skill in the art; in one embodiment, the input buffer circuit typically has a large input resistance.

Although MOSFETs are used as examples in the embodiments, those skilled in the art may use other types of transistors in substitution such as JFETs (junction field-effect transistors), MESFETs (metal-semiconductor field-effect transistors), or BJTs (bipolar junction transistors) in accordance with the principles of the present invention.

While the invention has been described by way of example and in terms of preferred embodiment, it is to be understood that the invention is not limited thereto. On the contrary, it is intended to cover various modifications and similar arrangements (as would be apparent to a person skilled in the art). Therefore, the scope of the appended claims should be accorded the broadest interpretation so as to encompass all such modifications and similar arrangements.

What is claimed is:

1. An electrostatic discharge (ESD) protection circuit, comprising:
a first n-type transistor, having a first terminal coupled to a supply voltage, a second terminal coupled to a reference voltage, and a gate, wherein the first n-type transistor couples the supply voltage to the reference voltage during an ESD event at an I/O pad;
a discharge acceleration circuit, coupling the gate of the first n-type transistor to the I/O pad during the ESD event and coupling the gate of the first n-type transistor to the reference voltage when there is no ESD event; and
a discharge time circuit, coupled to the discharge acceleration circuit and the supply voltage, controlling a discharge time of the first n-type transistor of coupling the supply voltage to the reference voltage during the ESD event at the I/O pad,
wherein the supply voltage is coupled to the I/O pad,
wherein a voltage potential of the I/O pad is higher than the supply voltage or lower than the reference voltage during the ESD event,
wherein the discharge acceleration circuit comprises:
a first p-type transistor, having a first terminal coupled to the I/O pad, a second terminal coupled to the gate of the first n-type transistor, and a gate directly connected to the supply voltage; and
a second n-type transistor, having a first terminal coupled to the discharge time circuit, a second terminal coupled to the gate of the first n-type transistor, and a gate directly connected to the supply voltage.

2. The electrostatic discharge (ESD) protection circuit of claim 1, further comprising a first diode having an anode coupled to the I/O pad and a cathode coupled to the supply voltage.

3. The electrostatic discharge (ESD) protection circuit of claim 2, further comprising a third p-type transistor having a first terminal coupled to the supply voltage, a second terminal coupled to the I/O pad, and a gate coupled to the supply voltage, wherein a voltage drop between the first and second terminals of the third p-type transistor is smaller than a voltage drop between the anode and the cathode of the first diode during the ESD event.

4. The electrostatic discharge (ESD) protection circuit of claim 1, further comprising a fourth n-type transistor having a first terminal coupled to the I/O pad, a second terminal coupled to an internal circuit, and a gate coupled to the supply voltage, wherein a voltage at the second terminal of the fourth n-type transistor coupled to the internal circuit does not exceed the supply voltage during the ESD event.

5. The electrostatic discharge (ESD) protection circuit of claim 1, wherein the discharge time circuit comprises:
   a resistor, having a first terminal coupled to the supply voltage and a second terminal;
   a capacitor, having a first terminal coupled to the second terminal of the resistor and a second terminal coupled to the reference voltage; and
   an inverter, having an input terminal coupled to the second terminal of the resistor and an output terminal coupled to the discharge acceleration circuit.

6. The electrostatic discharge (ESD) protection circuit of claim 5, wherein the inverter comprises:
   a second p-type transistor, having a first terminal acting as the output terminal of the inverter, a second terminal coupled to the supply voltage, and a gate acting as the input terminal of the inverter; and
   a third n-type transistor having a first terminal coupled to the first terminal of the second p-type transistor, a second terminal coupled to the reference voltage, and a gate coupled to the gate of the second p-type transistor.

7. The electrostatic discharge (ESD) protection circuit of claim 1, wherein the discharge time circuit comprises:
   a capacitor, having a first terminal coupled to the supply voltage and a second terminal coupled to the discharge acceleration circuit; and
   a resistor, having a first terminal coupled to the second terminal of the capacitor and a second terminal coupled to the reference voltage.

8. The electrostatic discharge (ESD) protection circuit of claim 1, further comprising a second diode having an anode coupled to the reference voltage and a cathode coupled to the I/O pad.

* * * * *